(12) United States Patent
Tsai et al.

(10) Patent No.: US 7,005,877 B2
(45) Date of Patent: Feb. 28, 2006

(54) BURN-IN ADAPTER

(75) Inventors: Ying-Chuan Tsai, Taipei (TW); Yi-Lin Chiang, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/889,115

(22) Filed: Jul. 13, 2004

(65) Prior Publication Data

US 2006/0012390 A1 Jan. 19, 2006

(51) Int. Cl.
*G01R 31/26* (2006.01)

(52) U.S. Cl. ........................ 324/765; 324/755

(58) Field of Classification Search ............ None
See application file for complete search history.

(56) References Cited

U.S. PATENT DOCUMENTS 6,472,895 B1 * 10/2002 Jaimsomporn et al. ..... 324/760
6,630,372 B1 * 10/2003 Ball ............................ 438/123
6,858,472 B1 * 2/2005 Schoenfeld .................. 438/117

* cited by examiner

Primary Examiner—Vinh P. Nguyen
(74) Attorney, Agent, or Firm—Bacon & Thomas, PLLC

(57) ABSTRACT

The present invention is to provide a burn-in adapter comprising a first connector, an interface circuit (e.g., RS-232 port), a jumper assembly, a reset instruction generator, and a second connector coupled to a motherboard, in which the interface circuit is electrically coupled to the first connector, the jumper assembly, the reset instruction generator, and the second connector respectively, different signal levels are generated by moving or removing a plurality of jumpers of the jumper assembly, the first connector is electrically coupled to a burn-in device via a first cable, and the second connector is electrically coupled to the motherboard via a second cable, thereby the burn-in adapter is adapted to burn a memory of the motherboard after generating a reset instruction and a burn-in signal level to cause the motherboard entering into a burn-in state.

6 Claims, 3 Drawing Sheets

BURN-IN ADAPTER

FIELD OF THE INVENTION

The present invention relates to burn-in devices and more particularly to a board-like burn-in adapter with improved characteristics.

BACKGROUND OF THE INVENTION

Conventionally, information is recorded on a memory (e.g., EEPROM (Electrically Erasable Programmable Read-Only Memory)) of motherboard of an electronic device (e.g., computer, server, or the like) by burning. This is best illustrated in FIG. 1. As shown, an interface circuit (e.g., RS-232 interface circuit) 12, a jumper assembly 13, and a connector 14 are formed on a motherboard 11. The interface circuit 12 is electrically coupled to the connector 14, the jumper assembly 13, and a memory 15 (e.g., EEPROM) of the motherboard 11 respectively. Also, the connector 14 is electrically coupled to a burn-in device (e.g., computer) (not shown) via a cable.

Referring to FIG. 1 again, jumpers 131 of the jumper assembly 13 are moved to positions to be adapted to generate a burn-in signal level prior to recording information on the memory 15 of the motherboard 11 (i.e., burn). Next, enable the motherboard 11 again such that the enabled motherboard 11 is able to detect the burn-in signal level of the jumper assembly 13. Once detected, the motherboard 11 enters into a burn-in state. As an end, the burn-in device can perform a burn-in on the memory 15.

However, the prior art burn-in technique suffered from several disadvantages. For example, a burn-in adapter circuit including the interface circuit 12, the jumper assembly 13, and the connector 14 must be provided on the motherboard 11, resulting in an increase in both the manufacturing cost and the area occupied by the motherboard 11. Further, it is required to reset the jumpers 31 of the jumper assembly 13 and restart the motherboard 11 whenever a burn-in is performed. This is very inconvenient. To the worse, the motherboard 11 may be maintained at a burn-in state (i.e., unable to start) if the jumpers 31 of the jumper assembly 13 were not moved back to their original positions after delivery from the manufacturer. Thus, continuing improvements in the exploitation of burn-in technique are constantly being sought.

SUMMARY OF THE INVENTION

After considerable research and experimentation, a novel burn-in adapter according to the present invention has been devised so as to overcome the above drawback of the prior art. These drawbacks are that a burn-in adapter circuit including an interface circuit, a jumper assembly, and a connector must be provided on a motherboard, and resetting jumpers of a jumper assembly and restarting the motherboard whenever a burn-in is performed.

It is an object of the present invention to provide a burn-in adapter such that after causing a motherboard to enter into a burn-in state by a reset instruction and a burn-in signal level a burn-in device is adapted to burn a memory of the motherboard.

To achieve the above and other objects, the present invention provides a burn-in adapter comprising a first connector, an interface circuit (e.g., RS-232 port), a jumper assembly, a reset instruction generator, and a second connector coupled to a motherboard in which the interface circuit is electrically coupled to the first connector, the jumper assembly, the reset instruction generator, and the second connector respectively, different signal levels are generated by moving or removing a plurality of jumpers of the jumper assembly, the first connector is electrically coupled to a burn-in device via a first cable, and the second connector is electrically coupled to the motherboard via a second cable.

Whereby pressing a button of the reset instruction generator for causing the reset instruction generator to generate and send a reset instruction to the motherboard, moving the jumpers of the jumper assembly to a position for generating a burn-in signal level, restarting the motherboard, and detecting a predetermined value of the burn-in signal level on the jumper assembly will cause the motherboard to enter into a burn-in state and cause the burn-in device to start burning a memory (e.g., EEPROM) of the motherboard.

It is another object of the present invention to provide a burn-in adapter wherein responsive to moving the jumpers of the jumper assembly to the first position for generating the burn-in signal level, a signal level of the jumper assembly changes from an original 12V to 3.3V as the burn-in signal level, the motherboard is adapted to restart, and the motherboard is adapted to enter into the burn-in state when the burn-in signal level is detected on the jumper assembly.

The above and other objects, features and advantages of the present invention will become apparent from the following detailed description taken with the accompanying drawings.

DETAILED DESCRIPTION OF THE PREFERRED EMBODIMENTS

Figure 1:
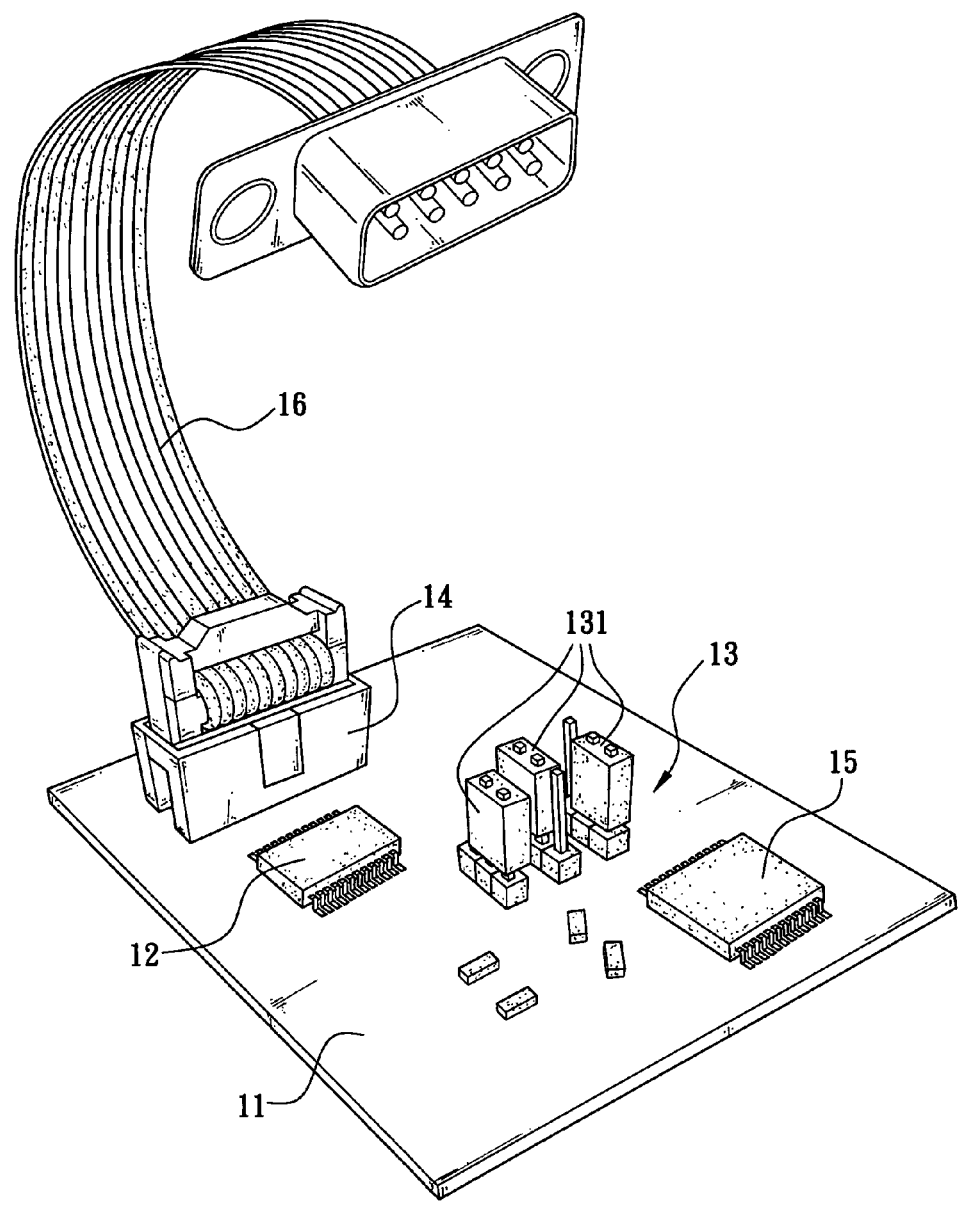
FIG. 1 is a perspective view of a conventional motherboard.
Figure 2:
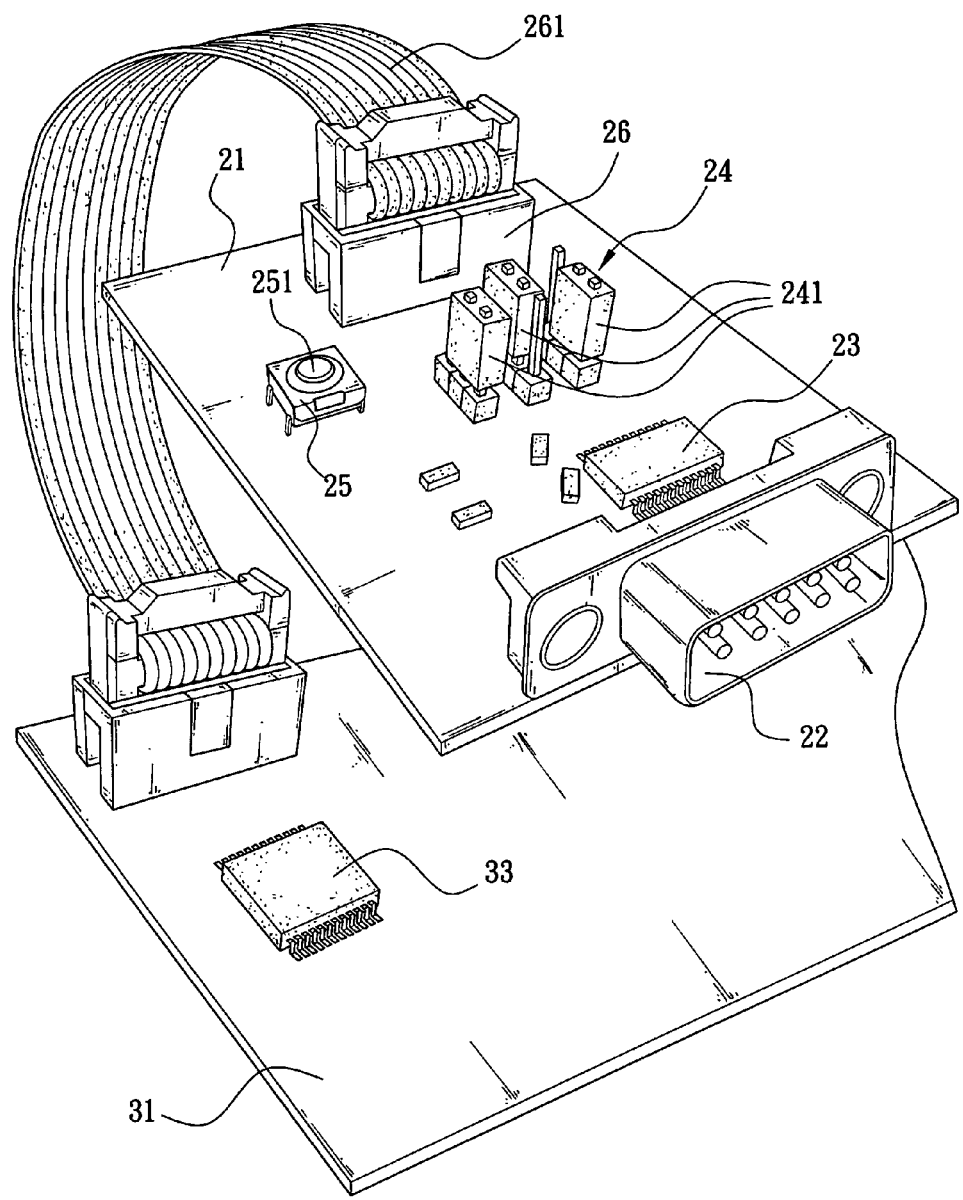
FIG. 2 is a perspective view of a motherboard and a coupled burn-in adapter according to the invention.
Figure 3:
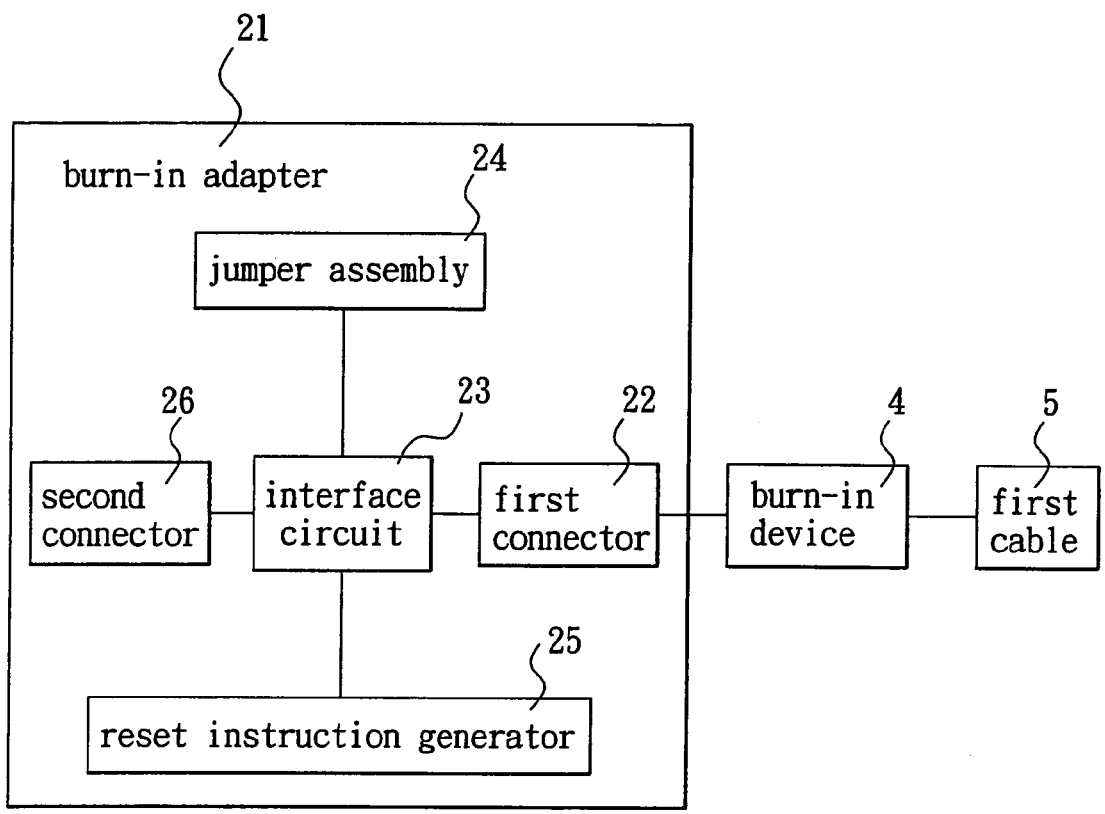
FIG. 3 is a block diagram of the burn-in adapter according to the invention.

Referring to FIGS. 2 and 3, there is shown a burn-in adapter 21 constructed in accordance with a preferred embodiment of the invention. The board-like adapter 21 comprises a first connector 22, an interface circuit (e.g., RS-232 port) 23, a jumper assembly 24, a reset instruction generator 25, and a second connector 26 coupled to a motherboard 31. The interface circuit 23 is electrically coupled to the first connector 22, the jumper assembly 24, the reset instruction generator 25, and the second connector 26 respectively. The jumper assembly 24 comprises a plurality of jumpers 241. As such, different signal levels by moving or removing the jumpers 241 of the jumper assembly 24 can be generated. The first connector 22 is electrically coupled to a burn-in device (e.g., computer) (not shown) via a cable (not shown). Also, the second connector 26 is electrically coupled to the motherboard 31 via another cable.

Referring to FIGS. 2 and 3 again, by configuring as above, for recording information on a memory (e.g., EEPROM) 33 of the motherboard 31 (i.e., burning), a user may press a button 251 of the reset instruction generator 25. In response, the reset instruction generator 25 generates and sends a reset instruction to the motherboard 31. At the same time, move the jumpers 241 of the jumper assembly 24 to a position to generate a burn-in signal level (e.g., 3.3V) and thus restart the motherboard 31. After restarting, the motherboard 31 enters into a burn-in state when a predetermined value (e.g., low) of the burn-in signal level is detected on the jumper assembly 24. As an end, the burn-in device begins to burn the memory 33.

Referring to FIGS. 2 and 3 again, disconnecting another cable 261 coupled to the second connector 26 from the motherboard 31 will return the motherboard 31 to its original state after burning. As an end, the burning is not adversely affected by the burn-in signal level on the jumper assembly 24.

Referring to FIGS. 2 and 3 again, the first connector 22 is implemented as an RS-232 port and is electrically coupled to the burn-in device via the cable.

Referring to FIGS. 2 and 3 again, the second connector 26 is implemented as a COM port and is electrically coupled to the motherboard 31 for data and instruction transfer.

Referring to FIGS. 2 and 3 again, in response to moving the jumpers 241 of the jumper assembly 24 to a position to generate a burn-in signal level, the signal level of the jumper assembly 24 changes from the original 12V to 3.3V (i.e., burn-in signal level). As such, the motherboard 31 is able to restart. After restarting, the motherboard 31 enters into the burn-in state when the burn-in signal level is detected on the jumper assembly 24.

Referring to FIGS. 2 and 3 again, in response to moving the jumpers 241 of the jumper assembly 24 to a position to generate an operating signal level, the signal level of the jumper assembly 24 changes from 3.3V (i.e., burn-in signal level) to 12V (i.e., operating signal level). As such, the motherboard 31 is able to restart. After restarting, the motherboard 31 returns to an operating state when the operating signal level is detected on the jumper assembly 24.

In view of the above, a burn-in adapter circuit is separately formed as a burn-in adapter 21 as embodied by the invention. Also, after connecting the burn-in adapter 21 to both the motherboard 31 and the burn-in device, the motherboard 31 enters into a burn-in state as caused by the reset instruction and the burn-in signal level of the burn-in adapter 21. The burn-in device then burns the memory 33 of the motherboard 31. In brief, the invention eliminates the prior deficiencies of requiring the mounting of a burn-in adapter circuit on the motherboard 31, and resetting the jumper assembly 24 and restarting the motherboard 31 whenever a burn-in is performed.

While the invention herein disclosed has been described by means of specific embodiments, numerous modifications and variations could be made thereto by those skilled in the art without departing from the scope and spirit of the invention set forth in the claims.

What is claimed is:

1. A burn-in adapter comprising:
   a first connector electrically coupled to a burn-in device via a first cable;
   a jumper assembly including a plurality of jumpers wherein different signal levels are generated by moving or removing the jumpers of the jumper assembly;
   a reset instruction generator;
   a second connector electrically coupled to a motherboard via a second cable; and
   an interface circuit electrically coupled to the first connector, the jumper assembly, the reset instruction generator, and the second connector respectively;
   whereby pressing a button of the reset instruction generator for causing the reset instruction generator to generate and send a reset instruction to the motherboard, moving the jumpers of the jumper assembly to a position for generating a burn-in signal level, restarting the motherboard, and detecting a predetermined value of the burn-in signal level on the jumper assembly will cause the motherboard to enter into a burn-in state and cause the burn-in device to start burning a memory of the motherboard.

2. The burn-in adapter of claim 1, wherein responsive to moving the jumpers of the jumper assembly to the position for generating the burn-in signal level, a signal level of the jumper assembly changes from an original 12V to 3.3V as the burn-in signal level, the motherboard is adapted to restart, and the motherboard is adapted to, enter into the burn-in state when the burn-in signal level is detected on the jumper assembly.

3. The burn-in adapter of claim 1, wherein the first connector is an RS-232 port.

4. The burn-in adapter of claim 1, wherein the second connector is a COM port.

5. The burn-in adapter of claim 1, wherein the interface circuit is an RS-232 port.

6. The burn-in adapter of claim 1, wherein the memory of the motherboard is an EEPROM.

* * * * *